(12) United States Patent
Guerrero

(10) Patent No.: US 6,199,625 B1
(45) Date of Patent: Mar. 13, 2001

(54) STACKABLE HEAT SINK FOR ELECTRONIC COMPONENTS

(75) Inventor: Fred Guerrero, Oxnard, CA (US)

(73) Assignee: PSC Computer Products, Inc., Oxnard, CA (US)

( * ) Notice: Subject to any disclaimer, the term of this patent is extended or adjusted under 35 U.S.C. 154(b) by 0 days.

(21) Appl. No.: 09/330,946

(22) Filed: Jun. 11, 1999

(51) Int. Cl.$^7$ .................................................. H05K 7/20
(52) U.S. Cl. .................................. 165/80.3; 165/185
(58) Field of Search ................... 165/80.3, 185, 165/182

(56) References Cited

U.S. PATENT DOCUMENTS

| | | |
|---|---|---|
| 1,805,116 | 5/1931 | Trane . |
| 1,854,278 | 4/1932 | Smith . |
| 1,893,270 | 3/1933 | Caldwell . |
| 3,457,988 | * 7/1969 | Meyerhoff et al. ............ 165/80.3 |
| 4,340,902 | 7/1982 | Honda et al. . |
| 5,175,612 | 12/1992 | Long et al. . |
| 5,351,166 | * 9/1994 | Kang ............................ 361/690 |
| 5,396,947 | 3/1995 | Itoh . |
| 5,412,535 | 5/1995 | Chao et al. . |
| 5,574,626 | 11/1996 | Smith . |
| 5,600,540 | 2/1997 | Blomquist . |
| 5,654,587 | 8/1997 | Schneider et al. . |
| 5,699,227 | 12/1997 | Kolman et al. . |
| 5,773,886 | 6/1998 | Rostoker et al. . |
| 5,794,684 | 8/1998 | Jacoby . |

FOREIGN PATENT DOCUMENTS 57-65524    4/1982  (JP) .

OTHER PUBLICATIONS

*Webster's Ninth New Collegiate Dictionary*, 1984, 560, Merriam–Webster, Inc. Springfield.

* cited by examiner

Primary Examiner—Allen Flanigan
(74) Attorney, Agent, or Firm—Andrea L. Mays

(57) ABSTRACT

A stackable heat sink having a core shaft in heat-engaging relation with a semiconductor device and a plurality of individual thin fins having an opening for receiving the core shaft in press fit relation so that a plurality of the fins, when mounted on the shaft, define a plurality of air passageways and the fins and shaft efficiently transfer heat away from the semiconductor device and into the surrounding atmosphere.

6 Claims, 7 Drawing Sheets

STACKABLE HEAT SINK FOR ELECTRONIC COMPONENTS

FIELD OF THE INVENTION

This invention relates to cooling of electronic components and assemblies through the provision of a heat sink.

BACKGROUND OF THE INVENTION

Integrated circuits or other electronic components are generally mounted on printed circuit boards which are then installed in an enclosure for the electronic equipment. A personal computer would be a typical electronic device that houses printed circuit boards having such electronic components. There has been since the advent of the integrated circuit a steady progression of larger and larger devices capable of performing more functions within a single component package. At the same time, there has been a trend toward the packing of a larger number of components onto a printed circuit board and within a given volume of an enclosure. The result of these two trends and others, has resulted in an increasing requirement for low-cost, efficient, heat-dissipating devices for use within the electronic equipment.

One type of heat-dissipating device is a simple fan mounted within the enclosure and designed to circulate air through the enclosure, removing the hot air and introducing cooler air so as to dissipate the heat generated by the electronic components. Another method of removing heat is the use of a heat sink. The term "heat sink" is here used in its normal dictionary definition: "a substance or device for the absorption or dissipation of unwanted heat (as from a process or an electronic device)." Webster's Ninth New Collegiate Dictionary, p. 560 (1984). A typical heat sink used in the electronics industry for dissipating heat from components will comprise a base and a plurality of fins. The heat sink base is secured in firm heat-transfer engagement with the electronic component so as to absorb the heat from the component, passing it into the plurality of fins, which in turn radiate the heat into the surrounding air. Heat sinks are normally constructed from high heat-conducting material, such as metal, including aluminum and copper. Heat sinks may be used in combination with a fan.

A typical heat sink may be formed from an aluminum extrusion in which the base and fins are integral. The extrusion is then cut off in sections, each section forming an individual heat sink. Since the extrusion process results in fins that are in parallel planes, the fins form a plurality of passages between the fins extending in one direction. When a heat sink is formed with passages in one direction, it is desirable to have the fan and heat sink located relative to one another so that the air flow of the fan is parallel with the air passages between the fins. That is of course not always possible or desirable for other reasons. It has therefore been common to machine passages in a perpendicular direction to the extruded air passages, resulting in a series of spike-like fins, as shown in U.S. Pat. No. 5,600,540. In that manner, the positioning of the heat sink relative to the fan offers greater design flexibility.

One of the shortcomings in the heat sinks described above is that they have a fixed heat-dissipating area for a given size determined by the height of the extruded fins. In many electronic assemblies, the electronic components are mounted on the printed circuit board in close relation to one another. Therefore, mounting a heat sink on a particular electronic device is more or less circumscribed by the area (width and length) of the electronic component. Generally speaking, the space in which the heat sink may be mounted is unrestricted as to height as opposed to the area of the component. However, since the height of the fins is predetermined by the extrusion, it is not possible to change the heat-dissipating area of a particular extruded heat sink without infringing upon the air space of adjacent components. The thermal designer for the electronic assembly is therefore faced with specifying a custom-made extruded heat sink of a particular height for a particular application, or attempting to accommodate the limited heat sink dissipation capability by selection of a more powerful fan. Thus, a heat sink with a fixed heat-dissipating area presents the thermal designer with a design restriction that is undesirable.

A related problem with the extruded heat sink is that even after the designer selects a heat sink of a given surface area and therefore heat-dissipating capacity, the use of the component in a particular printed circuit board configuration and in a specific electronic enclosure may change the thermal conditions in which the component and its associated extruded heat sink will be used, requiring redesign of the extruded heat sink or again resorting to removal of heat through a more powerful fan. Even after the manufacturing stage is reached, thermal testing may show that the theoretical calculations did not properly accommodate the heat generated and still further modifications to the heat sink dissipation surface area or fan must be designed.

In short, the thermal designer of electronic equipment is continually faced throughout the design and manufacturing process with the limitation of the surface area of an extruded heat sink because the size of the base is restricted by the crowded "real estate" on the printed circuit board and the height of the extruded heat sink is predetermined. Of course, heat sinks may be made with fins of different height, but that requires stacking of heat sinks of different heights to accommodate changes during the design process that results in different thermal conditions. It also complicates the inventory stocking of heat sinks in manufacturing as well as in customer service.

It is therefore a primary object of the present invention to provide a heat sink in which the heat-dissipating capacity may be varied at any point during design, manufacturing or use.

Another object of this invention is to provide a heat sink in which a plurality of fins may be manually added so as to increase the heat-dissipating surface capacity.

One other object of the present invention is to provide a construction whereby the heat is rapidly and efficiently dispersed to the fins where the heat is dissipated.

Still another object of the present invention is to provide a heat sink in which the air passages are in a plane parallel to the plane of the printed circuit board on which the electronic component is mounted and to which the heat sink is attached so as to accommodate air flow in any direction.

Yet another object of the present invention is to provide a heat sink that is of low cost, simple construction, made from common materials, and constructed using machine tools in common use.

SUMMARY OF THE INVENTION

The present invention comprises a heat sink for use with electronic components that includes a base of heat-conducting material for engaging a surface of the electronic component from which the heat is to be dissipated, a core shaft secured in the base, and a plurality of heat-dissipating fins mounted on the shaft forming a plurality of parallel air passages.

BRIEF DESCRIPTION OF THE DRAWINGS OF THE INVENTION

One embodiment of a heat sink constructed in accordance with the present invention in shown in perspective view in FIG. 1;

DETAILED DESCRIPTION OF SELECTED EMBODIMENTS OF THE INVENTION

Figure 1:
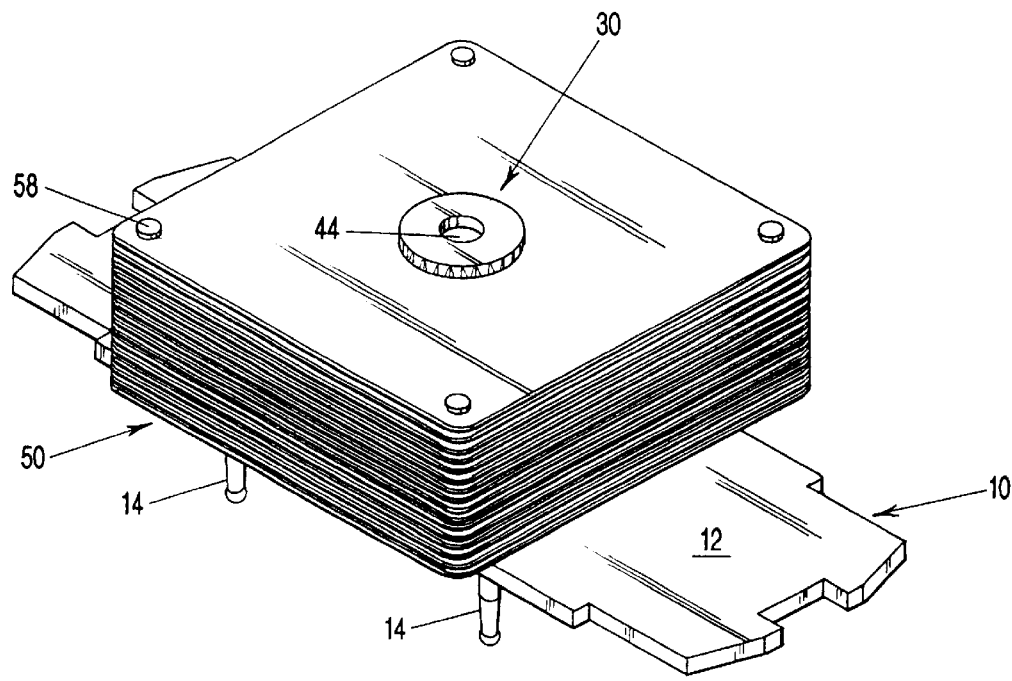

A first embodiment of the present invention is shown completely assembled in FIGS. 1 through 4. The invention comprises a base 10, a shaft 30, and a plurality of fins 50 that comprise a stackable heat sink for electronic components. The base 10 may comprise a plate 12 of heat-dissipating material, such as metal. Other types of material with good heat-conducting capability are also suitable for use in the invention. The particular configuration of base 12 is adapted to the electronic component and component mounting assembly and may be of any size or shape. The specific mounting plate 12 shown is for use in connection with the Intel S.E.C. cartridge. The base 12 provides the means for securing the heat sink to the cartridge thermal plate including the biasing means 14 for securing the plate 12 to the member on which the electronic component is mounted such as a printed circuit board or a cartridge. The plate or base 12 has an opening for receiving the shaft 30. The plate 12 may be attached to a cartridge containing the semiconductor device through plastic pins.

Figure 2:
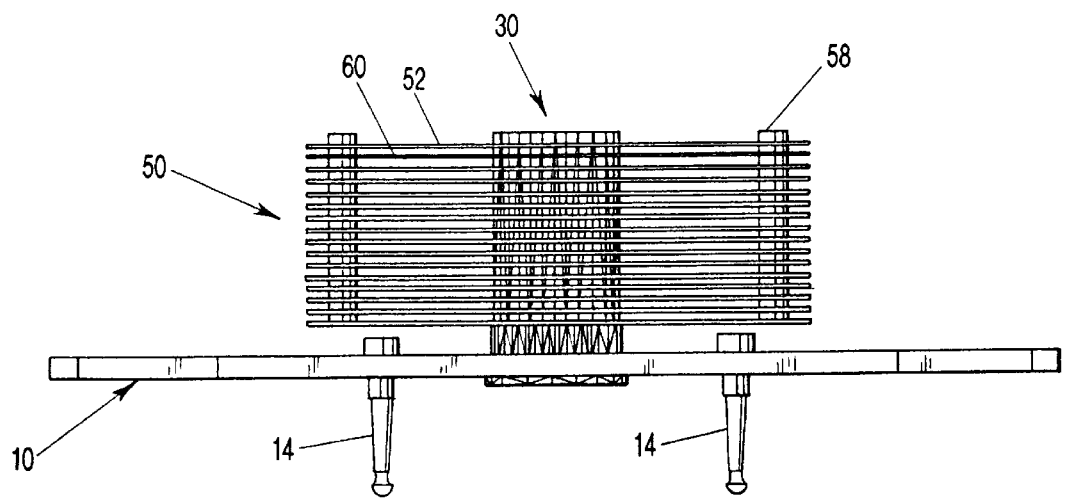
FIG. 2 is a side elevation view of the embodiment shown in FIG. 1.
Figure 3:
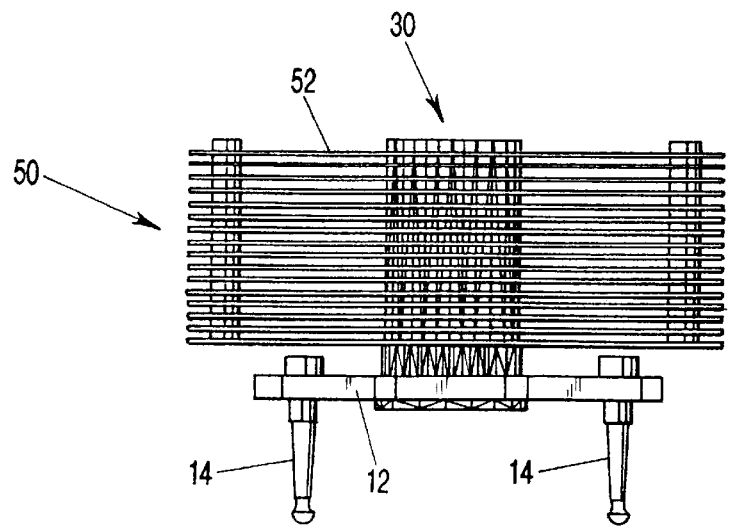
FIG. 3 is an end elevation view of the embodiment of the heat sink shown in FIG. 1.
Figure 4:
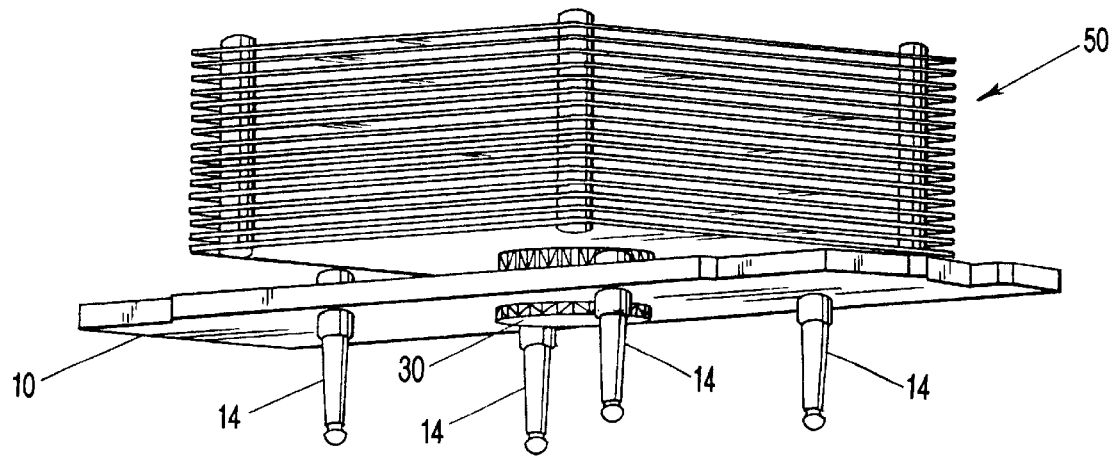
FIG. 4 is another perspective view of the embodiment of the heat sink shown in FIG. 1, showing the lower portion of the heat sink.
Figure 5:
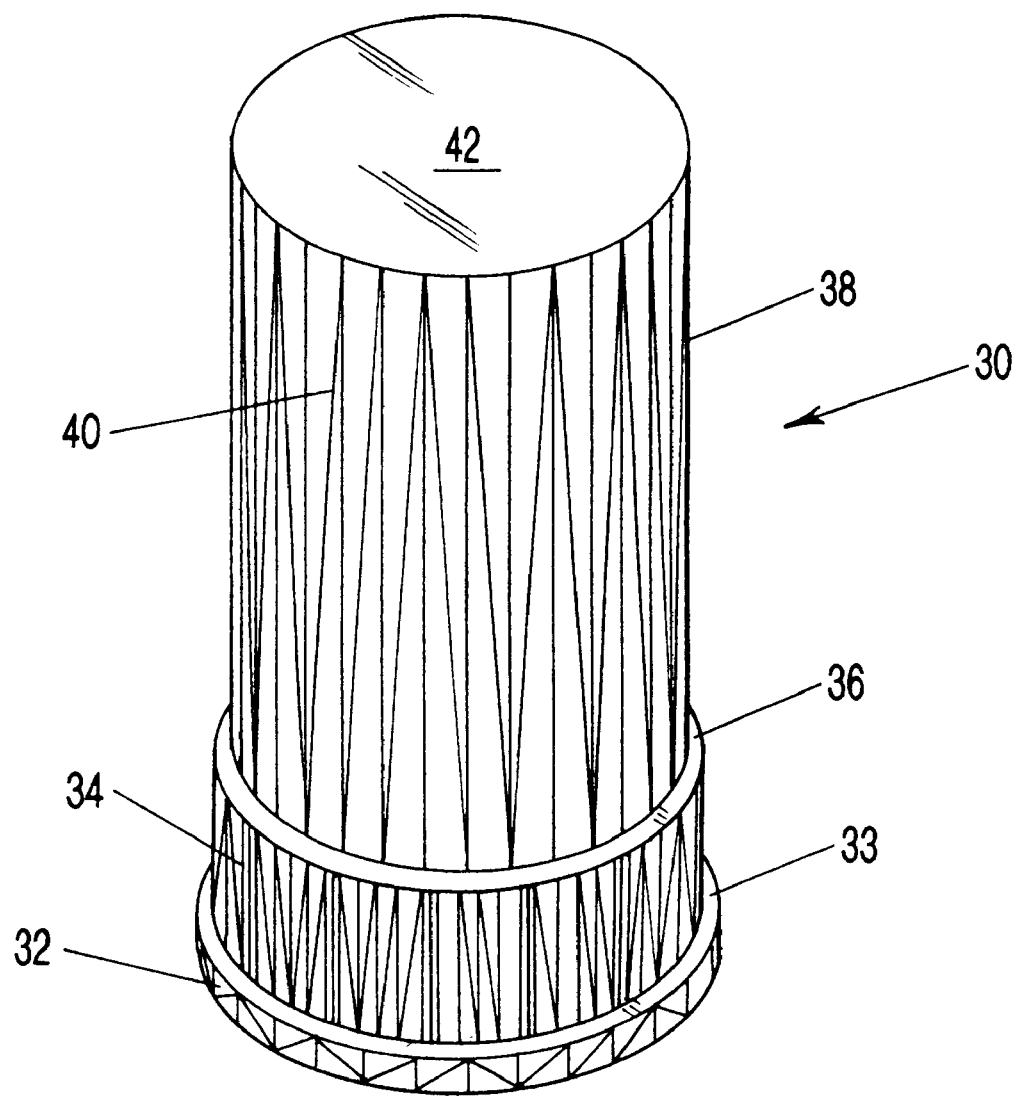
FIG. 5 is a detailed view of the shaft of the heat sink embodiment shown in FIG. 1.

Shaft 30 is shown in detail in FIG. 5. In the embodiments disclosed, the shaft 30 is generally cylindrical in shape, although it should be understood that the shaft cross-section could be square, rectangular, elliptical or other cross-section as may be selected for the particular manufacturing process and the intended use of the heat sink. The shaft 30 has three sections. The lowermost section comprises an annular lip 32 which as seen best in FIGS. 2 and 4, provides a stop or shoulder 33 for limiting the insertion of the shaft 30 into the base plate 12. A second section 34 has a slightly smaller diameter than annular lip 32. The diameter of section 34 is only slightly less than the diameter of the opening in the base plate 12. When the shaft 30 is assembled with the base 12, the section 34 of the shaft is press fit into the opening of the base. The height of the section 34 is greater than the thickness of the base 12 and forms a shoulder at its upper end indicated at 36. As seen best in FIG. 2, the shoulder 36 functions as a stop for the lowermost fin of the fin assembly 50. The third section of shaft 30 is of yet smaller diameter, as shown at 38, and extends from shoulder 36 to the upper end of shaft 30. As seen best in FIG. 1, when all of the fins, as will be described below, are assembled onto shaft 30, the upper end may be coined so as to increase the diameter of the top edge of the shaft section 38, thereby preventing the uppermost fin from disengaging with the shaft.

Figure 6:
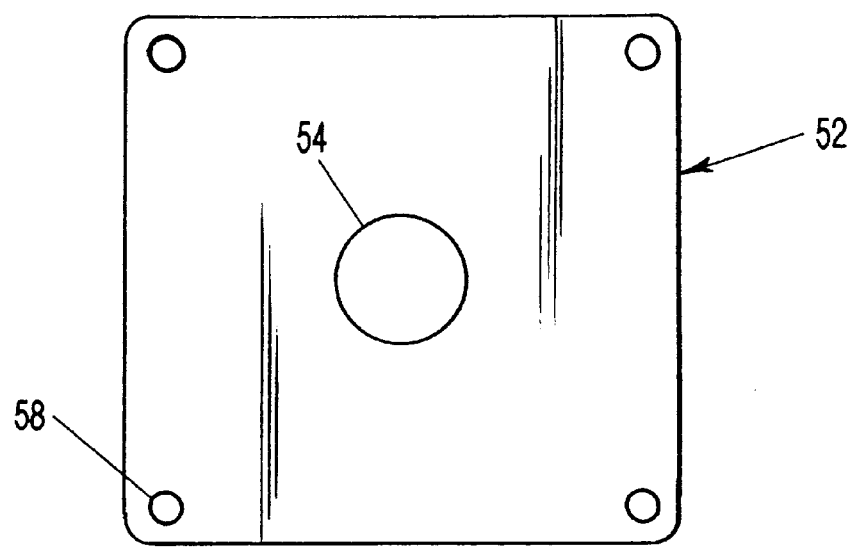
FIG. 6 is a detailed view of one of the typical fins included in the first embodiment of the heat sink shown in FIG. 1.
Figure 7:
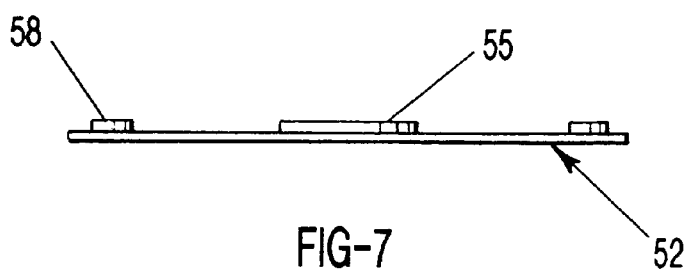
FIG. 7 is an end elevation view of the fin shown in FIG. 6.

The fin assembly 50 comprises a plurality of individual fins 52, one of which is shown in FIGS. 6 and 7. Fin 52 is shown in the embodiments disclosed as having a square or rectangular shape, although it will be appreciated that the shape of the fin could be round, oval, or some other geometric shape. Each fin is formed from a suitable heat-conducting material, such as metal, more specifically, aluminum. In the embodiment shown in FIG. 1, the fin's material stock is 0.015 inches and is made from 1100-H18 Aluminum. The fin 52 has an opening 54 which is shown located centrally in the fin, although it will be understood that the opening need not be centered within the geometric shape although that may be preferable for maximizing the heat conduction from the core shaft to all portions of the fin.

Figure 7A:
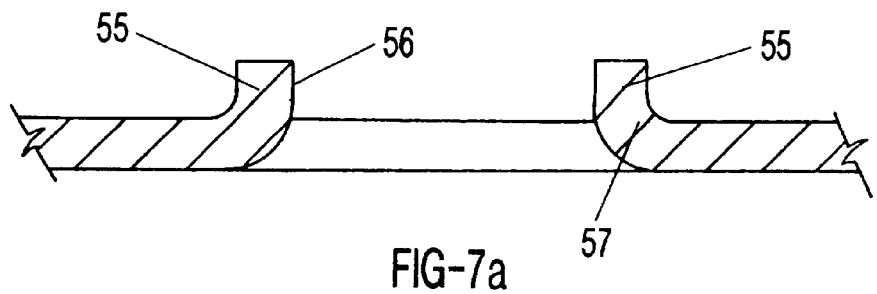
Figure 8:
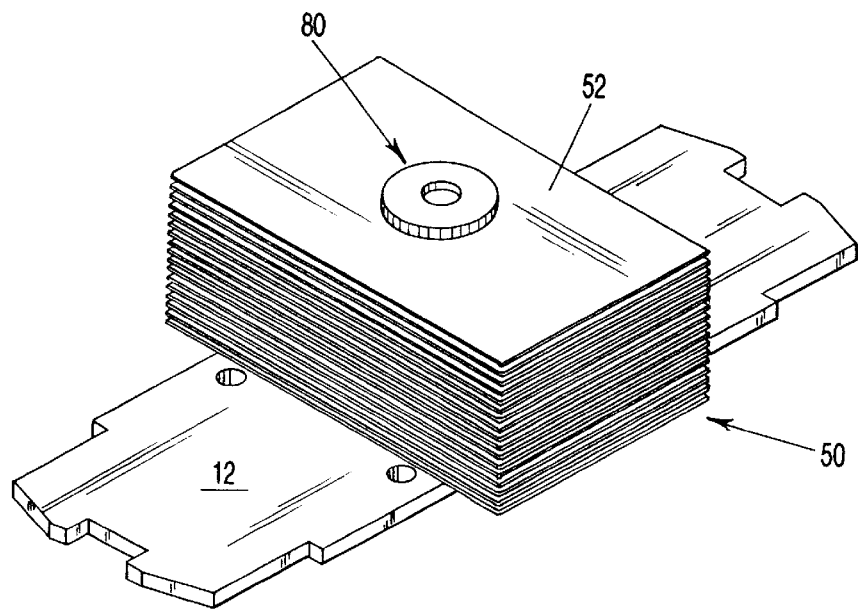
FIG. 8 is a perspective view of a second embodiment of the heat sink in accordance with the present invention.
Figure 9:
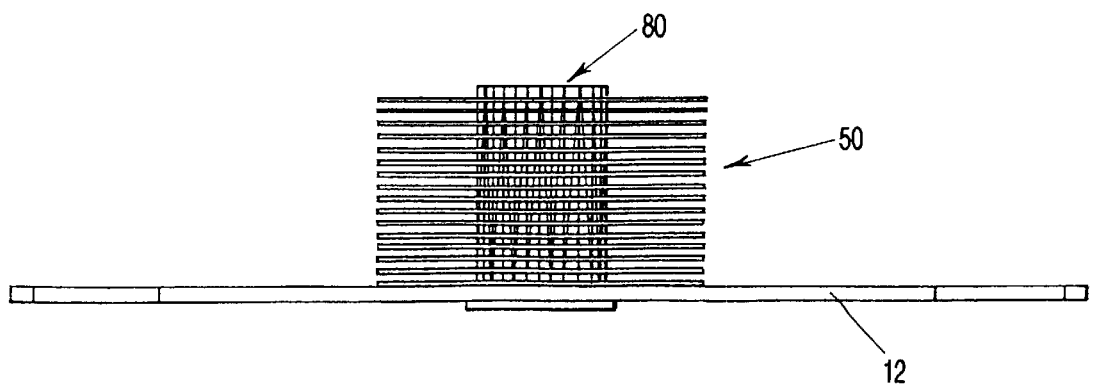
FIG. 9 is a side elevation view of the heat sink shown in FIG. 8.
Figure 10:
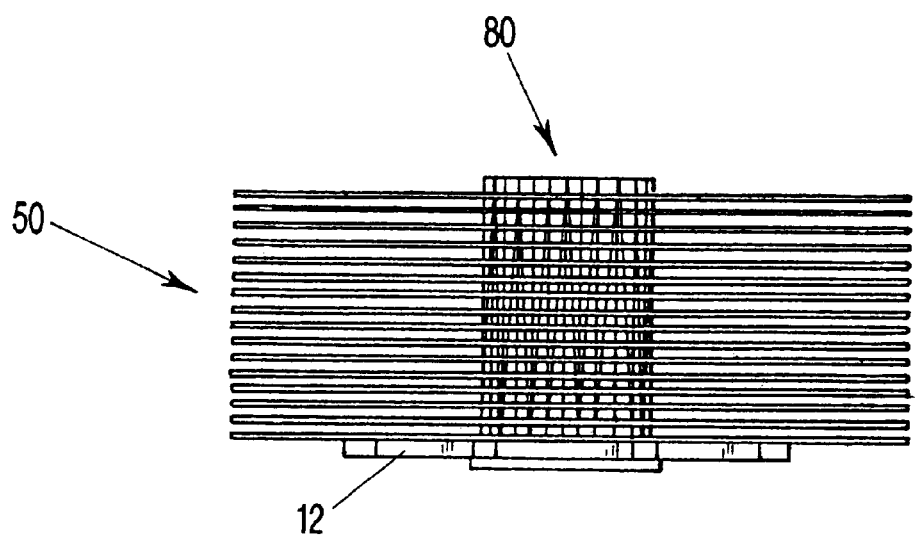
FIG. 10 is an end elevation view of the embodiment shown in FIG. 8.
Figure 11:
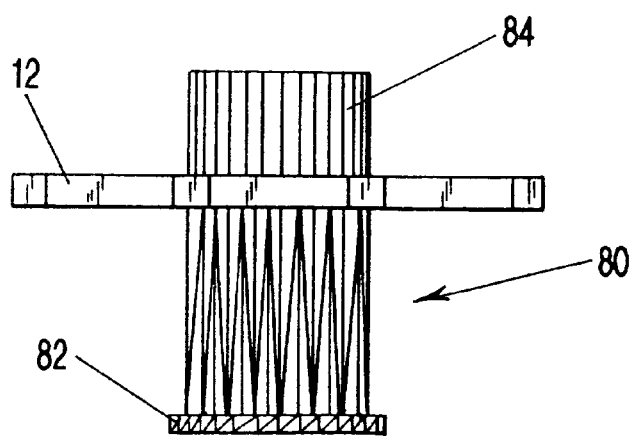
FIG. 11 is a detailed view of the shaft of a heat sink embodiment shown in FIG. 8.
Figure 12:
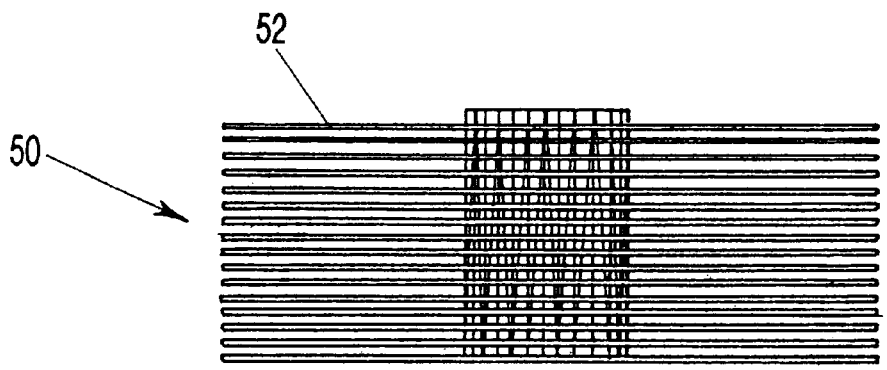
FIG. 12 is an assembly of fins for use in the second embodiment of the heat sink shown in FIG. 8.

The opening 54 is initially machined, such as by stamping, with a dimension that is less than the dimension of the third section 38 of shaft 30. The hole is then coined or swaged so as to create a flange shown at 55 in FIG. 7a. In the process of deforming the materials so as to create the flange 55, the surface area, indicated at 56, will be greater than the surface area of the opening before coining. Thus, by coining the opening 54, and producing the flange 55, the heat transfer area between the fin and the shaft section 38 will be increased, thus more effectively transferring heat from the core shaft to each individual fin. Furthermore, creation of the flange and increase of the engaging surface area between the fin and shaft will produce greater structural stability. Additionally, because the process of coining or swaging will create a radius in the material, as shown at 57, the opening on the bottom of the fin is slightly larger than the opening at the top of the fin, resulting in a funnel-shaped opening that facilitates positioning of the fin on the core shaft and forcing the fin down onto the shaft, as explained more fully below.

Each fin also includes at least several separators, indicated at 58, four of which are shown in this particular embodiment. As seen best in FIG. 7, the separators project above the surface of the fin and, as seen best in FIG. 2, will contact the adjacent fin, thereby preventing the fins from being inadvertently bent, or if a fin is not flat when originally manufactured, or any other condition that may result in restricting the air flow through the passage 60 between adjacent fins. A separator may have a variety of configurations. A separator could be a separate element that is attached to the fin by adhesive, soldering, or other means. If the separator is a separate element from the fin, it is preferably made of the same material. However, the preferable manner of forming the separators is to coin the material of the fin so as to create a dimple, protrusion, or other raised area. Such construction is extremely inexpensive and is extremely simple, as is desirable for purposes of cost, resisting detachment in the event of vibration or shock, or similar reasons. In the particular embodiment shown in FIGS. 1 through 7, if the fin has a material stock of 0.015 inches as indicated above, the height of the fin from the lower surface of the fin to the upper surface of the dimple would be 0.065 plus or minus 0.005 inches. It is desirable that the dimple have a height which is at least twice that of the thickness of the fin so as to assure continued maintenance of an air passageway between adjacent fins.

The outer surface of the core shaft is roughened so as to resist movement of the fins after assembly on the shaft. Such roughening may be in the nature of physically scoring the outer surface of the portions of the shaft, or more particularly by knurling the outer surface. Such knurling is shown at 40 on FIG. 5. It will be noted that both the upper or top or third section 38 is knurled, as well as the center or second portion 34. The shaft is constructed of a high heat transfer material, such as copper, to rapidly move the heat from the portion of the shaft closest to the heat source to the fins that are spaced apart on the shaft.

The stackable heat sink shown in the first embodiment may be built at the appropriate time to accommodate the heat generated in the component to which the heat sink is attached. Typically, the thermal engineer will determine the total heat dissipation surface area required for the application and thus specify for manufacturing personnel the number of fins that must be assembled onto the core shaft. The manufacturing operation can then pre-build heat sinks as required for production needs by assembling the complete heat sink. Such assembly involves insertion of the smallest diameter end of the core shaft into the opening in the base and forcing the entire shaft through the opening until the annular lip 32 contacts the bottom surface of the base plate 12. This press fit will normally keep the two parts in sufficient engagement during use of the heat sink. However, it would also be possible to secure the shaft to the base by other means, including adhesive, or mechanically by clips, threading the opening and second section of the shaft, or the like. The lip 32 also prevents the shaft 30 from being forced upwardly out of the opening in plate 12 when the assembly is subject to vibration or shock in the plane perpendicular to the plane of plate 12. The method or means for attaching the shaft to the base plate 12 does not form a critical part of the present invention. Once the shaft 30 and base 10 are assembled, then the specified number of fins may be assembled by aligning the opening 54 in each fin over the upper end of the shaft 30 and manually forcing the fin onto the shaft individually, or in a gang. Obviously, various types of automatic or semi-automatic tools could be used for forcing the fins onto the shaft where the number of heat sinks being constructed would warrant the expense of such non-manual assembling device. Finally, to secure all of the fins onto the shaft, the upper surface of the shaft, 42, may be coined, as shown at 44 in FIG. 1, resulting in a slight increase in the diameter of the shaft due to deformation of the material which will prevent the fin from working loose on the shaft such as may otherwise occur if the heat sink is being used in electronic equipment subjected to vibration or shock.

It will be appreciated that one of the advantages of the stackable heat sink is that should it be found in the manufacture of the equipment that thermal conditions were higher than originally designed for, or that a design computation failed to include all of the sources of heat generation, or for various other reasons, that the total heat-dissipating surface area of the heat sink may be easily changed by simply adding another fin. Moreover, it will also be appreciated that the base plate and core shaft provide the foundation for building heat sinks of various capacity. For example, if heat sinks are required of different dissipating capacity within the same piece of equipment, it would be unnecessary to inventory different physical heat sinks. Working with the foundation, and the specified number of fins required for the particular component, a single basic heat sink could be adapted for various types of components with different amounts of generated heat.

Referring now to FIGS. 8 through 12, a second embodiment of a heat sink constructed in accordance with the present invention is shown. In this heat sink, as shown best in FIG. 9, the fins 52 have a rectangular configuration wherein the long ends of the fin project beyond the edges of the base plate 12. Furthermore, as seen best in FIG. 11, the core shaft 80 has two sections, including the annular ring 82 and the roughened surface 84 of the second section of the shaft, which is of less diameter than the portion 82. In this embodiment, there are no separators to maintain the air passageways between adjacent fins. Moreover, the fins are pre-assembled and are inserted onto the section 84 of shaft 80 as a pre-assembled unit. The pre-assembly may attach individual fins to one another through various means such as an epoxy or the like. Furthermore, without the middle section 34, as shown in FIG. 5, the lowermost fin may be inserted all the way down the shaft until it contacts the upper surface of base plate 12. As in the first embodiment, the upper surface of shaft 80 may be coined so as to retain all of the fins on the shaft during use of the heat sink.

Figure 13:
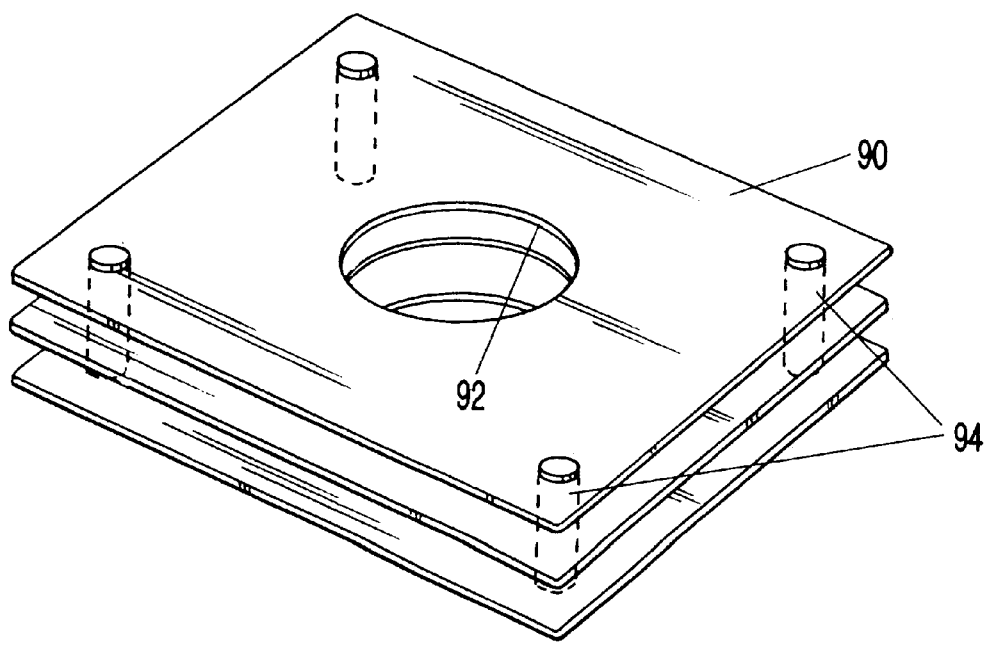
FIG. 13 is a third embodiment of a heat sink constructed in accordance with the present invention.

As shown in FIG. 13, there are alternative configurations if it is desired to pre-assemble the fins prior to insertion onto the shaft. In the embodiment shown in FIG. 13, the fins 90 have a central opening 92 for accommodating a shaft, such as shaft 30. The individual fins are held in place with at least several pins such as shown at 94 which are inserted through suitable holes made in the peripheral portions of each fin, thereby performing the dual function of creating a sub-assembly unit while simultaneously spacing the fins from one another so as to assure the maintenance of air passageway between adjacent fins.

The invention also contemplates the further extension of the heat capacity of a stackable heat sink by the provision of a second shaft similar in configuration to core shaft 30 or 80, but having a cylindrical opening or inset in the bottom of the shaft with a diameter approximately equal to the diameter of the upper end of a first shaft. When it is desired to increase the height of the stack, this second shaft may be press fit onto the top of the first shaft, thus effectively elongating the shaft and permitting the addition of other fins. In addition to securing the second shaft to the first by a press fit, other types of adhesive or mechanical fastenings may be used to secure the two shafts together.

It will therefore be seen that the several embodiments of the stackable heat sink invention accomplish the objectives as set forth above and provide a superior heat sink for electronic components. While various embodiments have been shown, it should also be obvious to those having ordinary skill in the art that there are still further variations in the materials, configurations, methods of attachment, and other features of the invention which while not disclosed, are encompassed within the spirit of the invention.

What is claimed is:

1. A stackable heat sink for electronic components comprising:
   a base with an opening;
   a core shaft secured in the base; and
   a plurality of thin heat-dissipating fins mounted on said shaft so as to form a plurality of parallel air passages between adjacent fins,
   said shaft upper end extending above the uppermost fin, and additionally comprising a second shaft having a cylindrical opening in the lower end for receiving the upper end of the first shaft, and additional fins mounted on the second shaft, so as to increase the heat-dissipating surface area of the heat sink.

2. A stackable heat sink assembly comprising:

a heat sink; and a base having an opening for securing and biasing said heat sink in heat-conductive relationship to an electronic component, and further including discrete attachment means operable to attach said base to a member upon which said electronic component is mounted;

said heat sink comprising a core shaft, said shaft having a first section comprising an annular lip and a second section having a smaller diameter than said lip inserted into said opening in said securing means and a plurality of thin heat-dissipating fins mounted on said shaft.

3. The assembly of claim 2 wherein said base for securing and biasing said heat sink against the electronic component comprises a base plate.

4. The assembly of claim 3 wherein said base plate is formed from a heat-conducting material.

5. The heat sink of claim 2 wherein each fin has a generally centrally located opening of slightly smaller dimension than the external dimension of said shaft so that each fin may be inserted onto said shaft with a press fit.

6. The heat sink of claim 1 wherein the fin opening is formed with a flange extruded from the fin so as to increase the surface area contact between the fin and shaft.

* * * * *